United States Patent [19]
Tuckerman et al.

[11] Patent Number: 5,804,004
[45] Date of Patent: Sep. 8, 1998

[54] STACKED DEVICES FOR MULTICHIP MODULES

[75] Inventors: David B. Tuckerman, Dublin; Nicholas E. Brathwaite, Hayward; Paul Marella, Palo Alto; Kirk Flatow, San Jose, all of Calif.

[73] Assignee: nChip, Inc., San Jose, Calif.

[21] Appl. No.: 655,338

[22] Filed: May 24, 1996

Related U.S. Application Data

[62] Division of Ser. No. 300,575, Sep. 2, 1994, which is a continuation of Ser. No. 881,452, May 11, 1992, abandoned.

[51] Int. Cl.$^6$ .................................................. H05K 3/32
[52] U.S. Cl. .............................. 156/60; 29/831; 29/850; 156/300
[58] Field of Search .................................... 156/150, 151, 156/182, 288, 295, 300, 313, 299, 60; 29/829, 830, 831, 842, 844, 850, 876, 877

[56] References Cited

U.S. PATENT DOCUMENTS

| | | | |
|---|---|---|---|
| 3,748,479 | 7/1973 | Lehovec | 250/208 |
| 4,320,438 | 3/1982 | Ibrahim et al. | 361/401 |
| 4,567,643 | 2/1986 | Droguet et al. | 29/575 |
| 4,761,681 | 8/1988 | Reid | 357/68 |
| 4,953,005 | 8/1990 | Carlson et al. | 357/80 |
| 4,983,533 | 1/1991 | Go | 437/7 |
| 4,996,583 | 2/1991 | Hatada | 357/70 |
| 5,019,943 | 5/1991 | Fassbender et al. | 361/396 |
| 5,019,946 | 5/1991 | Eichelberger et al. | 361/414 |
| 5,146,312 | 9/1992 | Lim | 357/70 |
| 5,214,844 | 6/1993 | McWilliams et al. | 29/840 |
| 5,239,447 | 8/1993 | Cotues et al. | 361/744 |
| 5,291,061 | 3/1994 | Ball | 257/686 |
| 5,323,060 | 6/1994 | Fogal et al. | 257/777 |
| 5,434,745 | 7/1995 | Shokrgozar et al. | 361/735 |

FOREIGN PATENT DOCUMENTS

| | | |
|---|---|---|
| 011627 | 2/1984 | European Pat. Off. . |
| 0128799 | 12/1984 | European Pat. Off. . |
| 57-31166 | 2/1982 | Japan . |
| 61-7658 | 1/1986 | Japan . |
| 61-59862 | 3/1986 | Japan . |
| 3-219664 | 9/1991 | Japan . |
| 4-56262 | 3/1992 | Japan . |
| 5-75014 | 3/1993 | Japan . |

OTHER PUBLICATIONS

A. Barfknecht et al., "Multichip Packaging Technology With Laser–Patterned Interconnects", *IEEE Trans. Components, Hybrids, and Manufacturing Technology*, vol. 12, No. 4, (1989)., pp. 646–649.

A.G. Bernhardt et al., "Multichip Packaging for Very–High–Speed Digital Systems", *Applied Surface Science*, vol. 46, pp. 121–130, (1990).

(List continued on next page.)

*Primary Examiner*—Francis J. Lorin
*Attorney, Agent, or Firm*—Townsend and Townsend and Crew LLP

[57] ABSTRACT

A method for fabricating a multichip module includes attaching a first integrated circuit to a silicon circuit board. Bonding pads on the first integrated circuit are wire-bonded to a first set of contacts on the circuit board. A second integrated circuit is adhesively attached onto the top of the first integrated circuit. The second integrated circuit includes a recessed bottom surface to provide an overhang over the first integrated circuit which exposes the bonding pads on the top surface of the first integrated circuit. Then bonding pads on the second integrated circuit are wire-bonded to a second set of contacts on the circuit board.

18 Claims, 8 Drawing Sheets

OTHER PUBLICATIONS

J. Drumm, "Bump and Lead Plating for High Density Interconnect Technology Development", Texas Instruments, Dallas, TX, pp. 670–682.

Hagge, "Ultra–Reliable Packaging for Silicon–on–Silicon WSI", *IEEE Transactions on Components, Hybrids and Manufacturing*, vol. 12, No. 2, pp. 170–179, (Jun. 1989).

K. Hatada et al., "Vertically Interconnected T–BTAB Devices for High Density Modules", *Proc. of IEPS*, pp. 645–650.

Maliniak, "Low–Cost Multichip Modules Push Limits of Packaging", *Electronic Design International*, (Jul. 1990).

J. Salzer, "Evaluating the Economic Factors of Automated Chip Bonding", *Microelectronic Methods*, pp. 29–31, (Feb. 1975).

S. Shanken et al., "Very High Density 3–D Packaging of Integrated Circuits", *ISHM 89 Proceedings*, Baltimore, MD, pp. 131–137, (1989).

Spielberger et al., "Silicon–on–Silicon Packaging", *IEEE Transactions on Components Hybrids and Manufacturing Technology*, vol. CHMT–7, No. 2, pp. 193–196, (Jun. 1984).

S. Stephansen et al., "Low Cost High Performance Silicon–on–Silicon Multichip Modules", *Proc. Wescon*, pp. 728–732, (Nov. 1990).

M. Suer, "A Prospective on 3–D IC Packaging", pp. 36.

D. Tuckerman, "Ultrahigh Thermal Conductance Microstructures for Cooling Integrated Circuits", *32nd Electronic Components Conf.*, pp. 145–149, (May 1982).

C. Val, "The 3D Interconnection Applications for Mass Memories and Microprocessors", Thomson CSF/DOI, France, pp. 851–860.

Val et al., "3–D Interconnection for Ultra–Dense Multichip Modules", *IEEE Transactions on Components, Hybrids and Manufacturing Technology*, vol. 13, No. 4, pp. 814–821, (Dec. 1990).

A. Weinberg, "High Density Electronic Packaging Utilizing Vertical Integration and Low Temperature Cofired Ceramics", *ISHM '90 Proceedings*, pp. 618–625, (1990).

Whitworth, "A Complex Tab for Space Hybrids", *ISHM 1989 Proceedings*, Baltimore, MD., pp. 612–619, (1989).

Wolfe, "Electronic Packaging Issue in the 1990s", *Electronic Packaging and Production*, (Oct. 1990).

"Insulation Coated Bonding Wire", *Tanaka Information*, (1990).

(PRIOR ART)

FIG. 1.

(PRIOR ART)

FIG. 2.

(PRIOR ART)

CONVENTIONAL BONDING

REVERSE WIRE BONDING (PRIOR ART)
FIG. 7.

FIG. 8.

STACKED DEVICES FOR MULTICHIP MODULES

This is a division of application Ser. No. 08/300,575, filed Sep. 2, 1994; which is an FWC of application Ser. No. 07/881,452, filed May 11, 1992, now abandoned.

BACKGROUND OF THE INVENTION

This invention relates to integrated circuit packaging and in particular to packaging of integrated circuits (ICs) on multichip modules.

Figure 1:
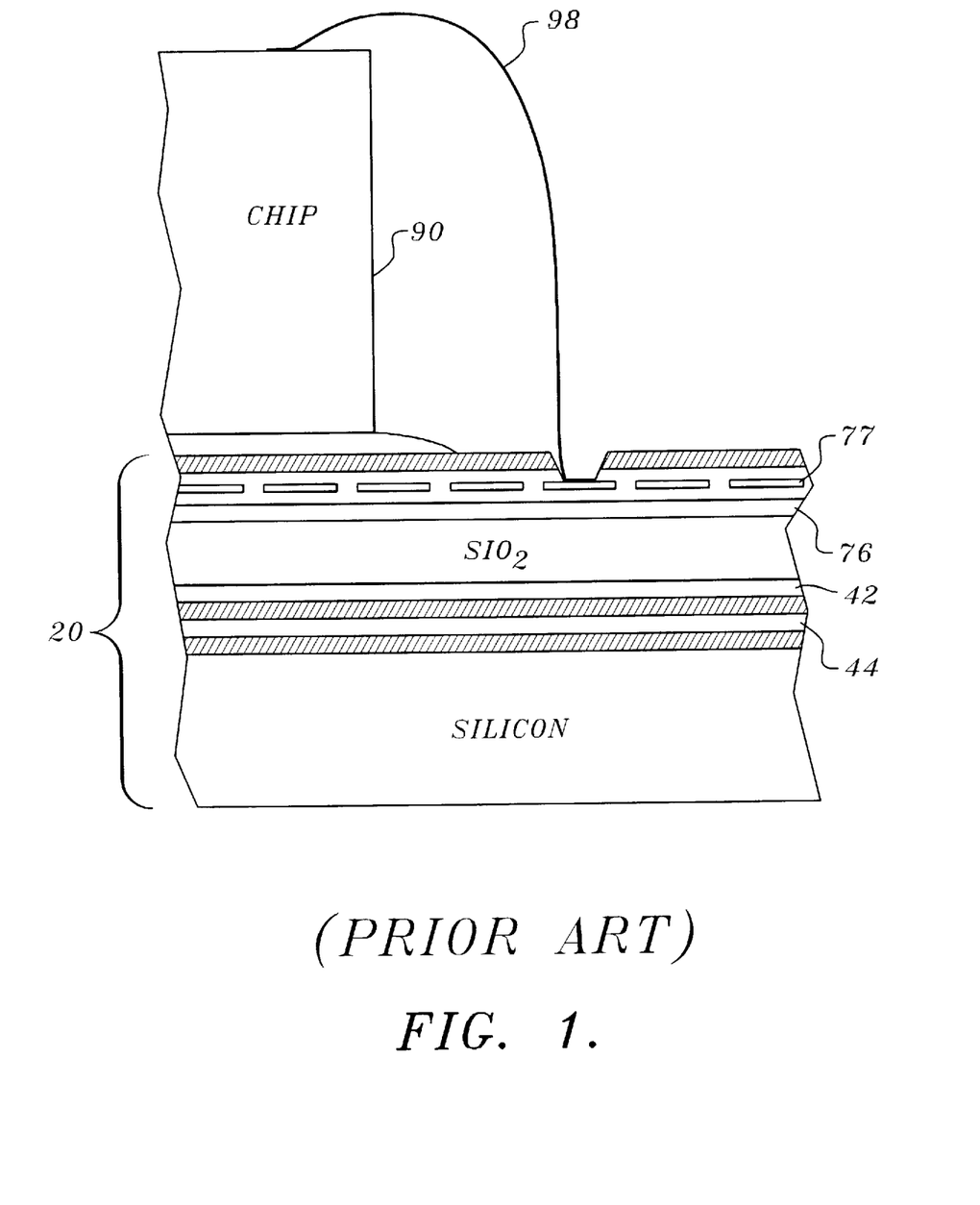
FIG. 1 is a cross sectional view of an example multichip module.

Multichip modules are a high density and performance packaging technique. FIG. 1 shows an example of a multichip module. Other multichip module structures are known in the art and may be used with the present invention. In the multichip module concept of FIG. 1, a silicon circuit board 20 contains layers of metalization 42 and 44 to form power and ground planes and interconnect lines 76 and 77. On the top surface of silicon circuit board 20, are mounted ICs 90 which are connected to the interconnect lines and power and ground planes by wire leads 98 to form the completed multichip module.

Figure 2:
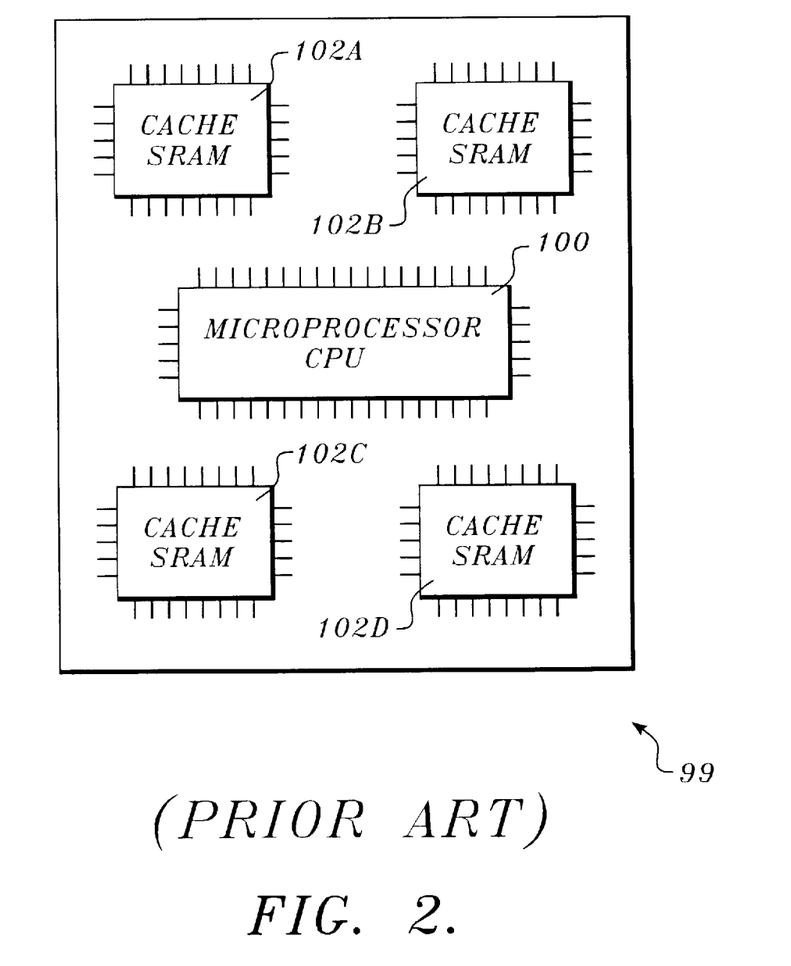
FIG. 2 is a top view of a multichip module.

FIG. 2 shows a top view of a completed multichip module 99 having a microprocessor CPU 100, and four memory chips 102a–102d mounted thereon. In the multichip module of FIG. 2, the four memory chips 102a–102d and associated leads consume more than 50% of the module surface area. Although a single CPU with four cache memory chips (SRAM) is shown in FIG. 2, the typical workstation design has a CPU of between 1–3 chips and 2 to 50 SRAM chips. As the number of chips included as part of the multichip module increases, the surface area and cost of the multichip module increase. Furthermore, increases in module surface area lengthen the interconnect distance between, for example, the CPU and supporting memory chips. This increase in distance increases the inductance, capacitance and resistance of the interconnection leads and produces corresponding increases in signal distortion and the time required to propagate a signal. In some cases, these performance impacts limit the CPU clock frequencies to less than the theoretical maximum and may impose other operating constraints on the system.

If chips can be packaged more densely on the surface of the silicon circuit board, the dimensions and cost of the module can be reduced and system performance improved. One possible method of maximizing packaging densities involves placing chips atop one another to form three dimensional stacks. Stacking of one chip atop the other is known in the hybrid industry, but only for purposes of repair. In the hybrid concept, a second chip is stacked atop the first chip when the first chip bonded to the board is non-functional. Problems with electrically insulating one chip from another and with wire tool clearance when bonding more than one chip in the stack limit the number of functional chips in the stack to just one chip. Thus, the only advantage of the hybrid stacking concept is to eliminate the need to allocate additional circuit board area for potential replacement chips.

Recently other stacking concepts have been developed. For example, a three dimensional memory block format has been proposed by various manufacturers, such as Texas Instruments, Irvine Sensors and Thomson CSF. The technology developed by Texas Instruments and Irvine Sensors (see U.S. Pat. No. 4,983,533) requires special processing to bring the input/output leads of each die, a bare integrated circuit, to a single edge. After dicing and testing, the individual die are glued one on top of the other. The edge of the resulting block with the die input/output now in an area array is ultimately surface mounted to a high density substrate.

Figure 3:
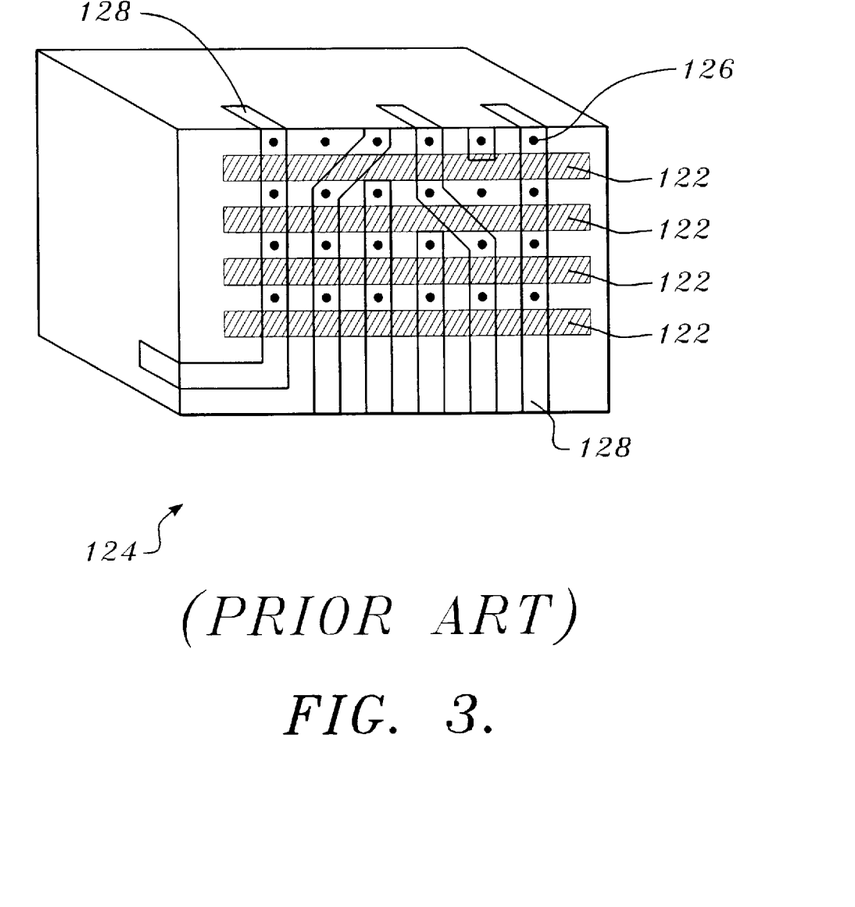
FIG. 3 is an illustration of a prior art three dimensional block.

The technology developed by Thomson CSF allows the use of standard bare die, which are wire bonded to a custom tape automated bonding (TAB) lead frame. FIG. 3 shows a chip stack fabricated using the Thomson CSF process. The die 122 are then stacked one on top of the other and molded into an epoxy block 124. When slabs are sawed off the sides of the block, the wire bonds 126 are exposed on all four sides. The exposed wire bonds are interconnected together using plating of various metals and laser techniques to form traces 128 that span all four side surfaces. The patterned block can then be bonded and electrically interconnected to a substrate.

The Texas Instruments, Irvine Sensor and Thomson techniques each require special processing and add significant costs to the fabrication of the multichip module. The special processing also introduces additional yield, quality control and reliability issues.

SUMMARY OF THE INVENTION

The present invention provides an alternative structure for reducing the size and complexity of multichip modules with less cost and technological risk than prior art devices.

According to one embodiment of the present invention, a bottommost chip is mechanically secured to a substrate and wire bonded to a first set of bond pads. A layer of adhesive is then placed over the first chip and a second chip is attached. The second chip is then wire bonded to a second set of bond pads. The process can be repeated until the desired stack height is reached.

The wire leads of the bottom chip can be electrically insulated from the upper chip in a variety of techniques. In one technique the edges of the upper chip are beveled to provide clearance for the wire lead of the lower chip. In another technique the wire lead on the lower chip can be itself insulated.

According to another embodiment of the present invention, the adhesive layer can contain a wire lead or be otherwise electrically conducting to enable stacking of chips requiring backside bias.

Other features and advantages of the present invention shall be described in greater detail below.

DESCRIPTION OF THE PREFERRED EMBODIMENT

Figure 4A:
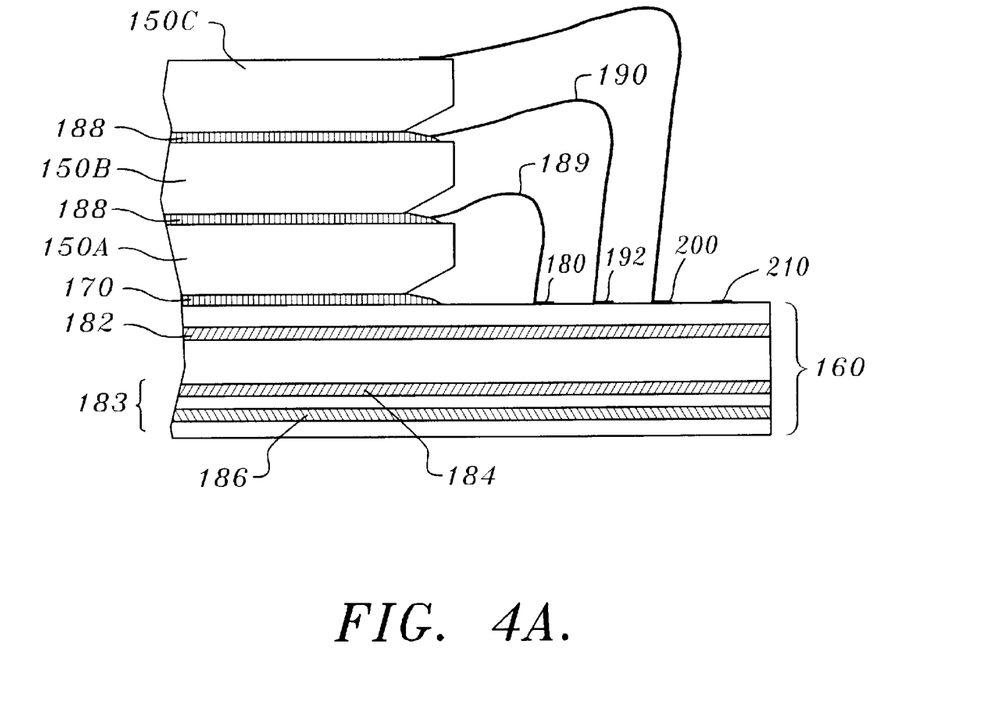
FIG. 4A is a side view of IC chips stacked according to an embodiment of the present invention.
Figure 4B:
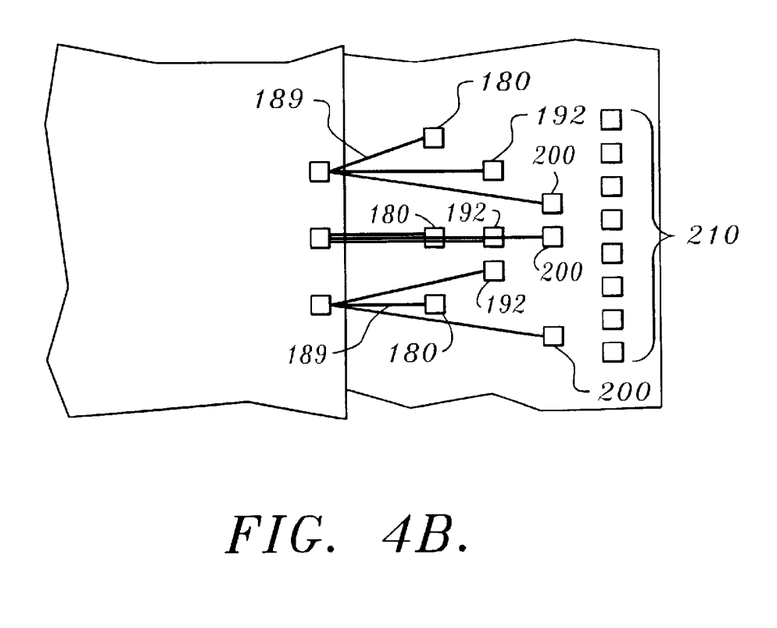
FIG. 4B is a top view of IC chips stacked atop a silicon circuit board according to an embodiment of the present invention.

FIGS. 4A and 4B illustrate IC chips stacked according to an embodiment of the present invention. FIG. 4A shows a side view of IC chips 150a–150c and FIG. 4B shows a top view of the stacked ICs as located on the top surface of a multichip module silicon circuit board 160. Although any type of IC may be used, chips not requiring a separate back side bias, such as twin tub CMOS for example, are preferable.

As seen in FIG. 4A, chip 150a is secured to a silicon circuit board 160 with a layer of adhesive 170. Chip 150a is then wire bonded to a set of bond pads 180 as seen in FIG. 4A and 4B. Substrate bond pads 180 provide contacts through vias for connecting IC 150a to interconnect layers 182 and conducting plane 183 containing power and ground planes 184 and 186 of the silicon circuit board 160. A wire bonding process employing reverse wedge bonding is preferred, as it provides low loop height and a shallow exit angle of the wires in the vicinity of the chip bond pad. The wires are nearly parallel to the chip surface. Substrate bond pad 180 is typically long enough for only a single wire bond rework, since removal of IC 150a is normally not performed if the chip is found defective.

Chips 150b–150c are stacked on top of chip 150a and atop each other preferably using a thermally conductive and electrically nonconductive adhesive 188 dispersed between each chip.

Chip 150b is bonded to a second set of substrate bond pads 192 as shown in FIG. 4B. Bond pads 192 are located at a further distance from the stack edge than bond pads 180. Chip 150c is bonded to yet a third set of bond pads 200 located at a still greater distance from the stack edge. FIG. 4B shows three examples of how the substrate bond pads may be staggered at different angles from the chip bond pad. Staggering can facilitate wire removal should removal later be necessitated and can also enable reduced chip to chip spacing. Other geometries than those shown in FIG. 4B are possible.

A set of engineering change pads 210 are also shown in FIG. 4B. The engineering change pads are located at the furthest distance from the stack edge. Pads 210 may be electrically connected within the substrate such that it is possible to connect to any or all of the connections made by pads 180, 192 and 200. The maximum number of engineering change pads equals the total number of chip leads. Typically, however, several signals are common to each of the stacked chips and a single engineering change pad can be provided for the common signals. Thus, the number of engineering change pads required is frequently less than the theoretical maximum.

If one of chips 150a–150c proves defective during functional testing or burn-in, wire bonds may be removed to electrically disable the chip from the circuit. An additional chip (not shown) may be mounted atop the existing stack and bonded to the appropriate engineering change pads to replace the defective chip. Alternatively, the replacement chip may be located at a different location on the substrate so long as suitable engineering change pads are located at that site.

In the embodiment shown in FIG. 4A, wire leads 189 and 190 are prevented from making contact with the adjacent upper chip by beveling the edge of the upper chip. The bevel extends from the chip edge inward to a distance beyond the chip bond pad of the chip below. In a preferred embodiment, the bevel angle is approximately 35°. The 35° angle typically exceeds the exit angle of the adjacent wire lead and ensures proper clearance.

Figure 5:
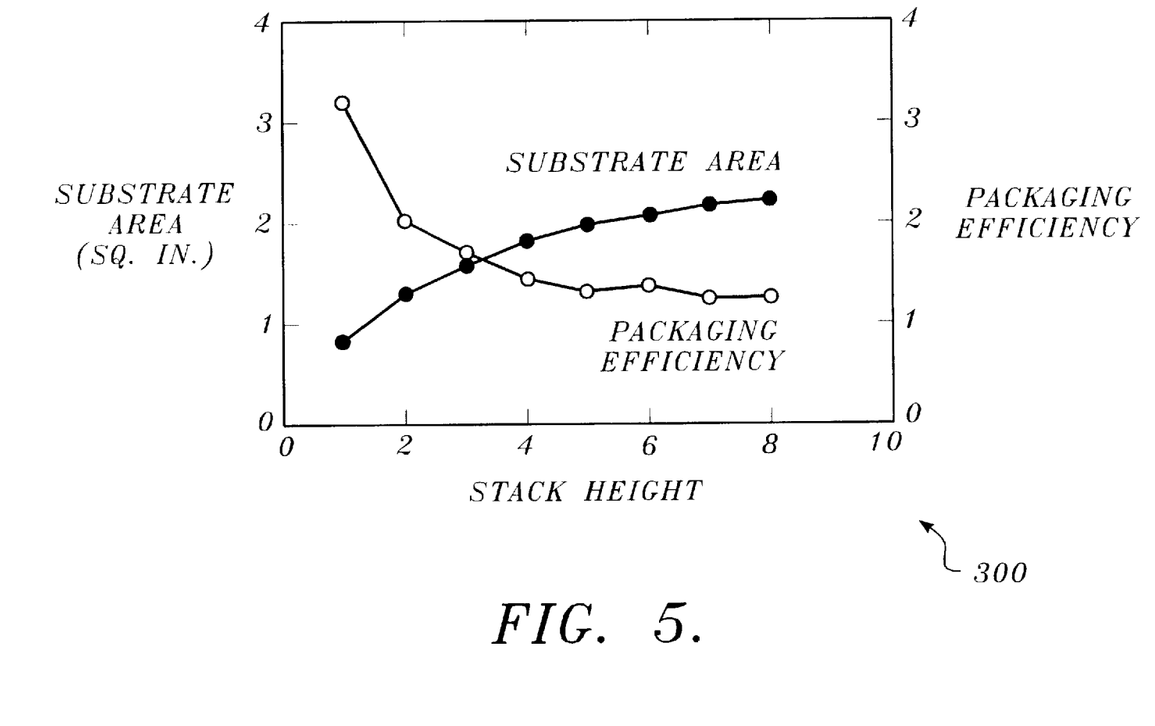
FIG. 5 is a graph of packaging efficiency and substrate area vs. stack height.

Although only three chips are shown stacked in FIG. 4A, any number of stacked chips are possible using the techniques of the present invention. In reality, however, the stack height is practically limited by the diminishing gains in packaging efficiency obtained by stacking an additional chip. Packaging efficiency is defined as the ratio of the sum of chip areas to the module surface area. FIG. 5 shows a graph 300 of packaging efficiency as a function of stack height for a chip set consisting of two ICs 0.5 in. per side and 20 memory chips 0.2×0.5 in. A 60° wire feed angle is assumed for mounting and interconnection. As seen from FIG. 5 for this chip dimension, a stack height of four provides a near minimum substrate area. The graph of FIG. 5 will vary however with the physical dimensions of the stacked chips and the number of wire leads associated with each stacked chip. Chips having a larger square area typically have taller optimum stack heights than chips having smaller square areas. Furthermore, although FIGS. 4A and 4B imply that the stacked chips are of similar dimensions, chips with dissimilar dimensions may in some cases also be stacked.

Figure 6:
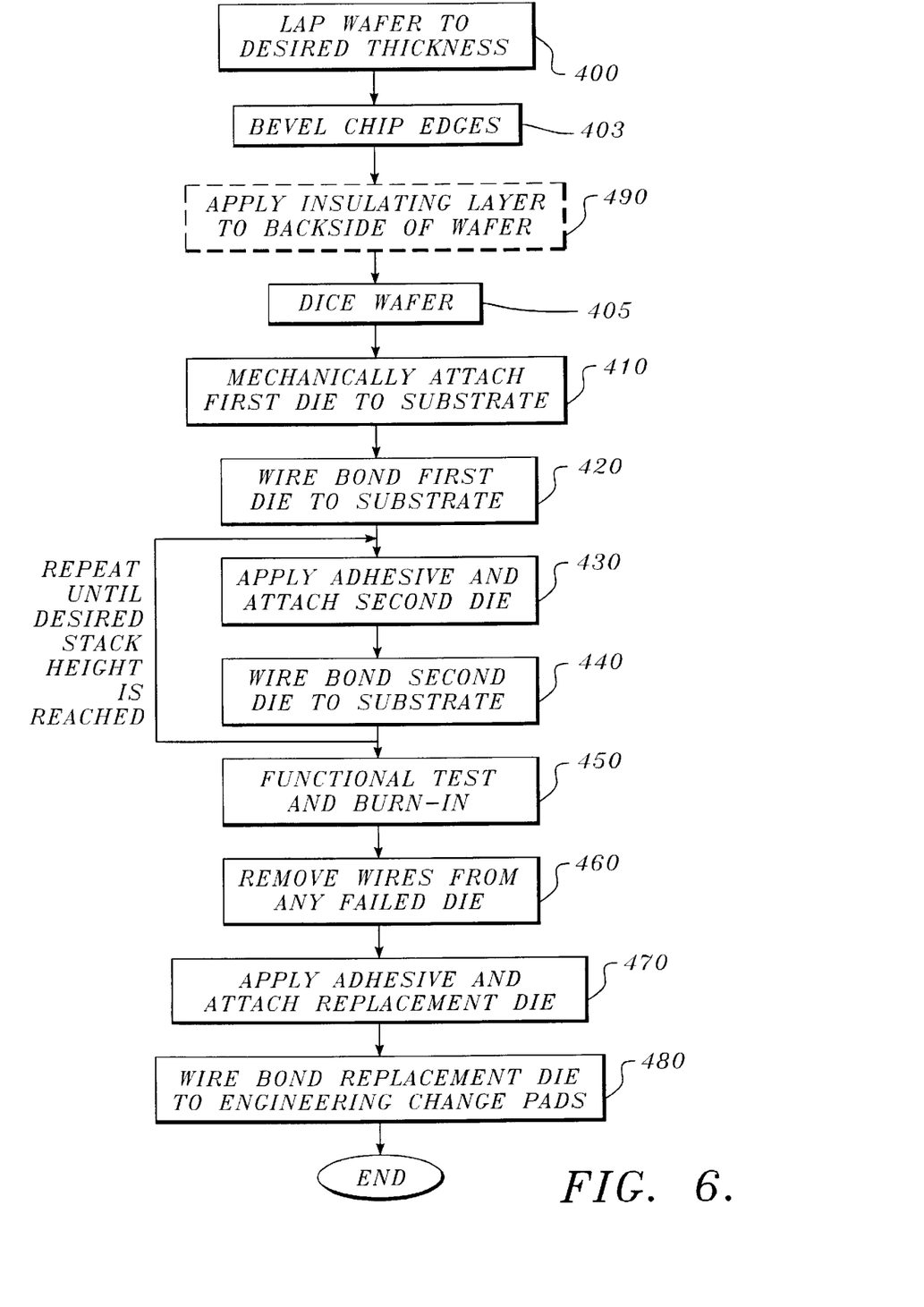
FIG. 6 is a flow chart of a method for stacking chips according to an embodiment of the present invention.

FIG. 6 contains a flow chart of a method of stacking chips according to the present invention to obtain a stack such as, or similar to, the stack shown in FIG. 4A. In step 400, chips 150a–150c of FIG. 4A have been initially lapped down to thicknesses of approximately 10–14 nil while still in wafer form according to techniques known to those of skill in the art. The exact thickness to which the chip should be lapped down may vary with the size and thickness of the wafer. When thinner chips are used, more chips can be stacked without encountering overall module package height limitations. A thinner chip also minimizes the length of the longest wire in the stack. However, excessive thinning/ lapping of the wafer weakens its structural integrity and creates yield and/or reliability problems. The 10–14 mil thickness appears a suitable number for most chips, although deviations from these values are possible.

If the chip edges are to be beveled to provide wire lead clearance, as discussed in connection with FIG. 4A, beveling can be performed in step 403 using a variety of techniques. With the chips in wafer form, conventional photolithography may be used to describe a pattern in the scribe lines on the back side of the wafer. An ethylene diamine pyrocatechol etchant or potassium hydroxide etchant may be used. Other known etchants may be used. To ensure alignment of the wafer, infrared alignment or laser drill hole techniques can be employed. Reference may also be made to a pair of precision ground wafer flats to locate the desired regions for etching on the backside of the wafer.

Optionally, mechanical techniques can be used to form the beveled edge. A saw having a resinoid diamond embedded cutting blade can form grooves of the desired dimensions along the backside of the wafer. The blade itself can also be beveled to yield a cut as pictured in FIG. 4A. Although in the preferred embodiment of FIG. 6, beveling of the chip takes place in step 403 before dicing of the wafer in step 405, a grinding wheel may also be used to grind individual die after dicing.

After dicing the wafer in step 405, the first chip 150a is placed atop an adhesive in step 410 to secure the chip to the silicon circuit board 160. The adhesive has suitable electrical, mechanical and thermal properties for the circuit design. After die attach, the adhesive is cured using techniques well known to those in the art.

In step 420, IC 150a is then wire bonded to bond pads located on the silicon circuit board 160. Wire bonding may be done using aluminum or gold wire ultrasonic wedge bonding, preferably in a reverse bonding sequence i.e., where the first bond is made on the substrate. The loop profile is kept low and has a steep vertical ascent and relatively flat horizontal component. The low profile minimizes the amount of beveling required on the upper chips to preclude contact between the wires and the silicon. When the chip is approximately 10–20 mils thick, a chip to bond pad clearance of 20–25 mils proves acceptable.

In step 430 of FIG. 6, chip 150b is bonded on top of chip 150a using an electrically nonconducting adhesive having sufficient thermal conductivity for the design in question. For example an adhesive filled with particles of aluminum oxide, boron nitride or diamond may be used. The adhesive typically has a nominal thickness of 1–5 mil and preferably 1–2 mil.

After the die attach adhesive is cured, low profile wire bonding of the chip 150b is performed in step 440. Step 440 may be performed using reverse wire wedge bonding. The substrate bond pads are typically located further from the corresponding chip bond pads than for the bottom most chip to ensure wire/tool clearance and to minimize the lead length. For reverse wedge bonding and a 60° feed angle, the substrate bond pads for the second chip in the stack will typically be located 8–15 mils beyond the substrate bond pads of the first chip. The lead length will therefore be increased approximately 20–35 mils over the first set of leads. The increment in inductance, less than 1 nH, is normally acceptable.

Figure 7:
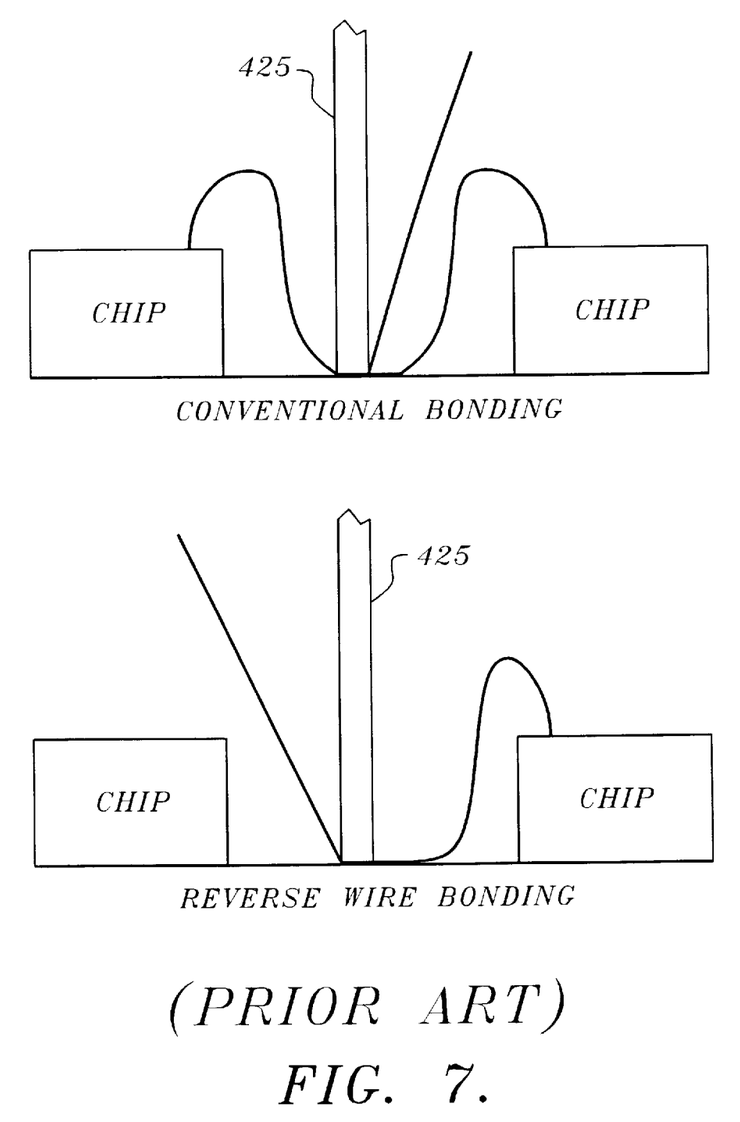
FIG. 7 is a comparison of conventional and reverse wedge bonding.

Step 440 may also be performed using slightly different techniques to minimize the lead lengths on the upper chips. For example, conventional forward bonding may be used to bond the taller chips and proves particularly suitable for the top most chip. This technique permits the bond pad for the upper chip to be located closer to the stack edge than if reverse wedge bonding were utilized. FIG. 7 shows a comparison of conventional and reverse wedge bonding. In conventional bonding, tool 425 first bonds to the chip and then to the bond pad. In reverse bonding, tool 425 bonds first to the bond pad and then to the chip.

In addition to varying the bonding technique, the same chips may be wire bonded at oblique angles to the chip edge while others are wire bonded in a perpendicular orientation. The oblique angles facilitate wire removal should a chip be found defective at test, as well as improving clearance between the wire bond tool and the existing wires thus enabling closer chip to chip spacing. Three examples of possible bond pad orientation were described in conjunction with FIG. 4B.

Upon bonding and attachment of the second chip in steps 430–440 of the embodiment of FIG. 6, additional chips are added to the stack. The additional chips are added by repeating steps 430–440 until the desired stack height is reached.

After formation of the stack, functional testing and burn-in of the completed multichip module takes place in step 450. A possibility exists that a chip located within the stack will fail the functional and burn in test process. The probability of multiple chip failures within the stack, is, however, remote. If a stacked chip does fail the test process, the wires from the failed chip are pulled and a replacement chip is attached on top of the existing stack in steps 460–470 or at a separate rework site on the substrate. Thus, removal of a failed part is not required. The new chip is bonded in step 480 to the appropriate set of engineering change pads previously described.

One issue to be addressed in stacking chips according to the present invention as described above, is ensuring that the wire leads do not electrically contact the back side of the chip above and cause a short. As discussed in step 403 the chip edges may be beveled to ensure wire clearance for the chip below. Also, if the final cured adhesive layer thickness exceeds the initial wire height chip above the chip edge, then no additional electrical insulation is normally required. Other means of insuring electrical insulation can be practiced in addition to or in lieu of beveling the chip edge.

For example, a thin, fully cured layer approximately 2 $\mu$m thick of a polymer such as photoresist or polyimide may be placed on the back side of the upper chip. The polymer can be placed on the chip by spinning it on the back of the chip wafer in optional step 490 prior to dicing. Alternatively, the polymer may be applied to a single die by a brief spray coating followed by an ultraviolet or thermal cure.

A third possibility for insulating the chip and wire leads is to electrically insulate the wire. Fine wires having a thin, typically 1 $\mu$m, insulation (e.g., polyurethane) are commercially available from Tanaka Denshi Kogyo K. K. of Japan. Optionally, the wire leads may be insulated by anodizing the wire. For example, aluminum wire can be anodized at 100V to form an anodic oxide of approximately 0.2 $\mu$m. This layer is thin enough to be scrubbed through by the ultrasonic bonding operation at those locations where the wire lead is contacted to a bond pad. In other locations along the surface of the wire lead, the oxide layer remains intact and provides electrical insulation.

Figure 8:
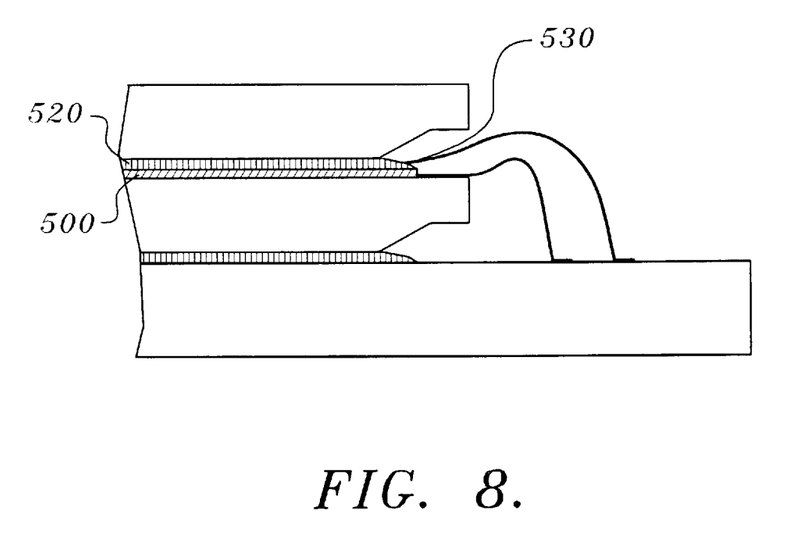
FIG. 8 is an enlarged side view of a chip stack geometry according to an embodiment of the present invention in which an upper chip requires back side bias.

For chips requiring back side bias, slightly modified procedures from that described in FIG. 6 may be used to insure both proper insulation and biasing of the chip. For example, steps 430 and 470 of FIG. 6 may be modified to include deposition of an additional layer of adhesive. FIG. 8 shows the resulting structure. In the structure of FIG. 8, the first layer of adhesive 500 serves partially as electrical insulation. The second layer of adhesive 520 may be formed of an electrically conducting adhesive to which a ground wire 530 is contacted. Adhesives known to those in the art may be used. Applicant's co-pending U.S. application, Ser. No. 07/629,731, describes various adhesive structures suitable for this purpose in addition to describing other adhesives suitable for use with the present invention.

Preferred embodiments of the invention have now been described. Additions and modifications will be readily apparent to those of ordinary skill in the art. For example, although the present invention has been described in connection with silicon substrates for multichip modules, other interconnection techniques of the present invention are adaptable for use on substrates such as, co-fired ceramic, thin film ceramic, or printed circuit boards. For this reason, the invention should be construed in light of the claims.

What is claimed is:

1. A method for fabricating a multichip module comprising the steps of:

attaching a first integrated circuit having a bonding pad region to a surface of a silicon circuit board;

wire bonding a conductor between said bonding pad region of said first integrated circuit and a first set of bond pads located on said circuit board;

placing a layer of adhesive atop said first integrated circuit;

placing a second integrated circuit having a recessed bottom surface along a bottom edge of said second integrated circuit atop said layer of adhesive wherein at least a portion of said recessed bottom surface of said second integrated circuit overhangs said bonding pad region of said first integrated circuit; and wire bonding a conductor between said bonding pad region of said second integrated circuit and a second set of bond pads located on said circuit board.

2. A method for fabricating a multichip module comprising the steps of:

attaching a first integrated circuit having a bonding pad region to a circuit board having first and second sets of bonding pads;

wire bonding a conductor between said bonding pad region of said first integrated circuit and said first set of bonding pads located on said circuit board;

adhering a second integrated circuit having a recessed portion along a bottom edge atop of said first integrated circuit so that said recessed portion of said second integrated circuit overhangs said bonding pad region of said first integrated circuit.

3. The method of claim 2 wherein said second integrated circuit includes a bonding pad region, said method further comprising the step of wire bonding a conductor between said bonding pad region of said second integrated circuit and said second set of bonding pads located on said circuit board.

4. The method for fabricating a multichip module of claim 3, wherein said circuit board further comprises a third set of bonding pads, the method further comprising the steps of:

attaching a third integrated circuit atop of said second integrated circuit wherein a portion of said third integrated circuit overhangs said bonding pad region of said second integrated circuit, said third integrated circuit including a bonding pad region and said second and third integrated circuits are attached in a substantially parallel orientation; and wire bonding a conductor between said bonding pad region of said third integrated circuit and said third set of bonding pads located on said circuit board.

5. The method for fabricating a multichip module of claim 3, wherein said step of wire-bonding a conductor between said bonding pad region of said first integrated circuit and said first set of bonding pads comprises the step of wire bonding an insulated wire between said bonding pad region of said first integrated circuit and said first set of bonding pads located on said circuit board.

6. The method for fabricating a multichip module of claim 3, wherein said step of wire-bonding a conductor between said bonding pad region of said second integrated circuit and said second set of bonding pads comprises forward wedge bonding a conductor between said bonding pad region of said second integrated circuit and said second set of bonding pads located on said circuit board.

7. The method for fabricating a multichip module of claim 3, further comprising the steps of:

testing said first and said second integrated circuits;

pulling wire leads associated with a defective one of said first and said second integrated circuits;

adhesively attaching a replacement integrated circuit atop of said second integrated circuit and wire _bonding a conductor between said replacement integrated circuit and a set of engineering change bond pads wherein said engineering change bond pads comprise a union of electrical networks encompassed by said first and said second set of bond pads.

8. The method for fabricating a multichip module of claim 4, wherein said step of wire_bonding a conductor between said bonding pad region of said third integrated circuit and said third set of bonding pads comprises forward wedge bonding a conductor between said bonding pad region of said third integrated circuit and said third set of bonding pads located on said circuit board.

9. The method for fabricating a multichip module of claim 4, wherein said step of attaching a third integrated circuit atop of said second integrated circuit comprises the step of adhesively attaching said third integrated circuit atop of said second integrated circuit using a thermally conducting and electrically nonconducting adhesive.

10. The method for fabricating a multichip module of claim 4, wherein said step of attaching a third integrated circuit atop of said second integrated circuit comprises the step of adhesively attaching said third integrated circuit atop of said second integrated circuit using an electrically conducting adhesive.

11. The method for fabricating a multichip module of claim 2, further comprising the step of beveling an edge of said second integrated circuit.

12. The method for fabricating a multichip module of claim 2, wherein said step of wire_bonding a conductor between said bonding pad region of said first integrated circuit and said first set of bonding pads comprises the step of reverse wire wedge bonding a conductor between said bonding pad region of said first integrated circuit and said first set of bonding pads located on said circuit board.

13. The method for fabricating a multichip module of claim 2, wherein said step of attaching a second integrated circuit atop of said first integrated circuit comprises the step of adhesively attaching said second integrated circuit atop of said first integrated circuit using a thermally conducting and electrically nonconducting adhesive.

14. The method for fabricating a multichip module of claim 2, wherein said step of attaching a second integrated circuit atop of said first integrated circuit comprises the step of adhesively attaching said second integrated circuit atop of said first integrated circuit using an electrically conducting adhesive.

15. A method for fabricating a multichip module comprising the steps of:

adhesively attaching a first integrated circuit having a bonding pad region located on an upper surface of said first integrated circuit and a bottom surface having a portion under said bonding pad region on said upper surface of said first integrated circuit partially cut away to a circuit board having first and second sets of bonding pads so that said first integrated circuit is oriented substantially parallel to said circuit board;

wire bonding a conductor between said bonding pad region of said first integrated circuit and said first set of bonding pads located on said circuit board;

thereafter, adhesively attaching a second integrated circuit having a bonding pad region located on an upper surface of said second integrated circuit and a bottom surface having a portion under said bonding pad region on said upper surface of said first integrated circuit partially cut away to said upper surface of said first integrated circuit so that said partially cut away portion of said second integrated circuit overhangs said bonding pad region of said first integrated circuit and so that said second integrated circuit is oriented substantially parallel to said first integrated circuit; and wire bonding a conductor between said bonding pad region of said second integrated circuit and said second set of bonding pads located on said circuit board.

16. The method of claim 15 wherein said portion partially cut away in each of said first and second integrated circuits comprises a beveled edge.

17. The method of claim 16 wherein said portion partially cut away in each of said first and second integrated circuits comprises a notch.

18. A method for fabricating a multichip module comprising the steps of:

providing a wafer having an upper surface comprising a plurality of integrated circuits, each of said plurality of integrated circuits including first and second bonding pad regions along opposing edges of said each integrated circuit;

cutting beveled edges along a bottom surface of said wafer to correspond generally with said opposing edges of each of said plurality of integrated circuits;

thereafter, dicing said wafer along said beveled edges to separate said plurality of integrated circuits;

providing a circuit board having first and second sets of bond pads;

adhesively attaching a first of said plurality of integrated circuits to said circuit board so that said first integrated circuit is oriented substantially parallel to said circuit board;

wire bonding conductor wires between each of said first and second bonding pad regions of said first integrated circuit and said first set of bonding pads located on said circuit board;

thereafter, adhesively attaching a second of said plurality of integrated circuits atop of said first integrated circuit in a manner in which beveled edge portions of said second integrated circuit overhang each of said first and second bonding pad regions of said first integrated circuit and so that said second integrated circuit is oriented substantially parallel to said first integrated circuit; and wire bonding conductor wires between each of said first and second bonding regions of said second integrated circuit and said second set of bonding pads located on said circuit board.

* * * * *